United States Patent [19]

Lynes

[11] 4,188,671
[45] Feb. 12, 1980

[54] SWITCHED-CAPACITOR MEMORY

[75] Inventor: Dennis J. Lynes, Madison, N.J.

[73] Assignee: Bell Telephone Laboratories, Incorporated, Murray Hill, N.J.

[21] Appl. No.: 959,207

[22] Filed: Nov. 7, 1978

Related U.S. Application Data

[63] Continuation of Ser. No. 761,806, Jan. 24, 1977, abandoned.

[51] Int. Cl.[2] .................................................. G11C 11/24
[52] U.S. Cl. ..................................... 365/149; 307/238; 365/150; 365/178; 365/174
[58] Field of Search ................. 365/51, 149, 150, 174, 365/178, 186

[56] References Cited

U.S. PATENT DOCUMENTS

| | | | |
|---|---|---|---|
| 3,387,286 | 6/1968 | Dennard | 365/149 |
| 3,614,753 | 10/1971 | Wahlstrom | 365/149 |
| 3,810,124 | 5/1974 | Hoffman | 365/149 |
| 3,876,992 | 4/1975 | Pricer | 365/149 |
| 3,979,734 | 9/1976 | Pricer et al. | 365/149 |

Primary Examiner—Terrell W. Fears
Attorney, Agent, or Firm—Lucian C. Canepa

[57] ABSTRACT

A memory cell comprising a single transistor and an associated capacitor constitutes the basic building block of a new and improved random-access-memory array. If, for example, the GIMIC-O technology is used for fabricating the cell, it is possible to achieve a bipolar cell whose area is less than one square mil. An advantageous 16K-bit LSI memory chip characterized by high speed and low cost is thereby made feasible. An MOS version of the memory cell is also proposed.

7 Claims, 9 Drawing Figures

SWITCHED-CAPACITOR MEMORY

CROSS-REFERENCE TO RELATED APPLICATION

This application is a continuation of my copending application, Ser. No. 761,806, filed Jan. 24, 1977 now abandoned.

BACKGROUND OF THE INVENTION

This invention relates to memory arrays and, more particularly, to semiconductive memory cell designs suitable for fabrication in large-scale-integrated (LSI) form.

In recent years considerable effort has been directed at devising memory arrays that can be made as LSI chips with a minimum of processing complexity. This effort has resulted in a variety of proposals for relatively simple memory cell designs. A particularly simple such memory cell is described in U.S. Pat. No. 3,876,992. Each individual memory cell in U.S. Pat. No. 3,876,992 comprises a single transistor and an associated capacitor.

Despite the simplicity of the cells shown in U.S. Pat. No. 3,876,992, the fabrication of those cells in LSI form in a memory array does not result in as small an array area as is desired in some applications of practical importance. Moreover, the processing required to form such an LSI array is relatively complicated. In addition, the complex voltage waveform that must be applied to the word lines of the array during writing and reading operations complicates the design of the overall array.

Accordingly, the need arose for a simple small-area memory cell that could be more easily made in LSI form and operated by the application thereto of relatively simple waveforms. It was recognized that such a cell, if available, would enable the fabrication of improved LSI memory arrays.

SUMMARY OF THE INVENTION

An object of the present invention is a small-area memory cell that is implementable in a relatively simple way in an LSI chip.

More specifically, an object of this invention is a low-cost high-speed LSI memory array that includes a multiplicity of such cells.

Briefly, these and other objects of the present invention are realized in a specific illustrative embodiment thereof that is fabricated in LSI form by utilizing the bipolar technology known as GIMIC-O. The basic memory cell of the unit comprises a single transistor and a capacitor. Uniquely, the capacitor is directly connected between the emitter electrode of the transistor and an associated digit line.

BRIEF DESCRIPTION OF THE DRAWING

A complete understanding of the present invention and of the above and other objects, features of advantages thereof may be gained from a consideration of the following detailed description presented hereinbelow in connection with the accompanying drawing in which.

DETAILED DESCRIPTION

Figure 1:
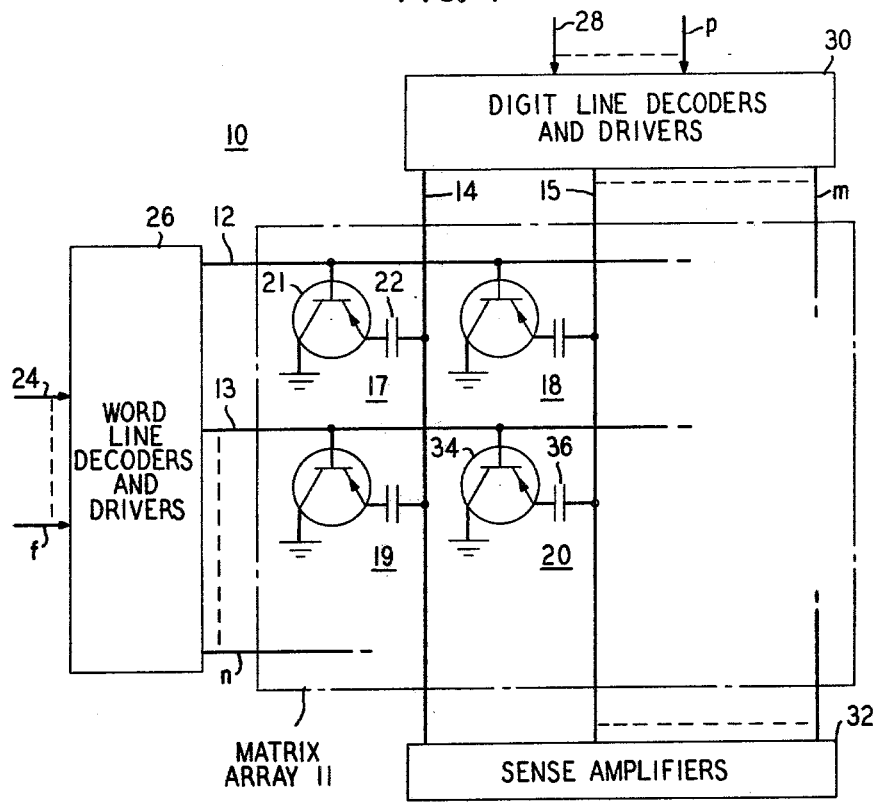
FIG. 1 shows a simplified memory array that includes specific illustrative bipolar cells made in accordance with the principles of the present invention.

FIG. 1 is a simplified schematic showing of a random access memory unit 10 which includes as one constituent thereof a matrix array 11 that illustratively embodies the principles of this invention. The matrix 11, which is included within dashed lines in FIG. 1, comprises a coordinate array that includes multiple horizontal and vertical conductors whose intersections define a multiplicity of storage locations. Herein the horizontal conductors 12, 13 ... n will be referred to as word lines and the vertical conductors 14, 15 ... m as digit lines.

Various standard memory configurations, each including at least one array of the type shown in FIG. 1, are known in the art. In one such specific illustrative configuration, two interconnected matrix arrays each including 64 word lines and 128 digit lines are combined with conventional decoders, drivers and timing circuitry to form a memory system having 16,384 individual storage locations. Such a system is commonly designated a 16K-bit memory.

In FIG. 1 a specific illustrative memory cell made in accordance with the principles of the present invention is connected at each storage location of the array 11. So as not to unduly clutter the drawing, only four such cells, 17, 18, 19 and 20 are explicitly shown in FIG. 1. Advantageously, the cells ae all identical to each other. Each cell comprises a single pnp transistor and a capacitor connected in the particular manner shown. Thus, for example, the cell 17 comprises transistor 21 having its base electrode directly connected to the word line 12, its emitter electrode connected via capacitor 22 to the digit line 14 and its collector electrode connected directly to a point of reference potential such as ground.

Selection of a particular word line in FIG. 1 is accomplished in a conventional way by applying a data word to input leads 24 ... f of a unit 26 that includes word line decoders and drivers. Similarly, selection of a particular one or set of digit lines is accomplished by applying a data word to input leads 28 ... p of a unit 30 that includes digit line decoders and drivers. The FIG. 1 arrangement also includes standard sense amplifiers 32 which determine during so-called reading operations whether "0" or "1" representations are stored in selected cells of the array.

The operation of the unit 10 shown in FIG. 1 will be described with reference to the voltage waveforms depicted in FIG. 2. Assume that initially, that is, prior to the time designated $t_1$ in FIG. 2, each of the word lines 12, 13 ... n is maintained at a quiescent potential of, for example, 5 volts. Assume further that it is desired to establish a "0" representation in one of the cells, say, in the cell 20 which is connected at the intersection defined by word line 13 and digit line 15 of FIG. 1. To accomplish such a write-0 operation, the potential applied to word line 13 is lowered to a negative potential (for example, −1 volt) during the interval between $t_1$ and $t_2$ while the potential on digit line 15 is maintained at 0 volts. For this set of conditions, no current flows in the emitter-collector path of the transistor 34 included in the cell 20. Hence, the previously uncharged capacitor 36 in the cell 20 remains uncharged. This uncharged condition is representative, for example, of a "0" indication.

Figure 2:
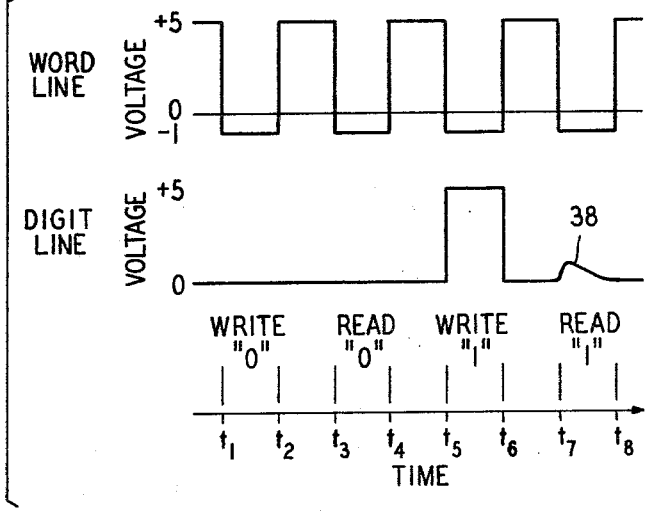
FIG. 2 depicts writing and reading signals that are applied to the FIG. 1 array.

Interrogation or reading of a memory cell is carried out by applying to specified word and digit lines the respective potentials that are shown in FIG. 2 as occurring in the interval $t_3$–$t_4$. These potentials are the same as those depicted in the interval $t_1$–$t_2$. Accordingly, if the capacitor in the cell being interrogated is uncharged (representative of a "0" signal), no current flows in the digit line connected to the cell being read. In turn, the sense amplifier associated with that digit line interprets the absence of current flow therein as indicative of a "0" being stored in the interrogated cell.

The manner in which a "1" representation is established in a selected memory cell is indicated by the waveforms shown in FIG. 2 in the interval $t_5$–$t_6$. To write a "1" in, say, the cell 20, a potential of, for example, −1 volt is applied to the word line 13 and a potential of, for example, +5 volts is applied to the digit line 15. In response thereto the transistor 34 is rendered conductive and current flows from emitter to collector therein. As a result the capacitor 36 is charged (right-hand plate positive with respect to the left-hand plate) to a potential of approximately 5 volts.

In FIG. 2, interrogation of the cell 20, including the charged capacitor 36, is shown as taking place in the interval $t_2$–$t_8$. In this so-called read-1 interval, the collector-to-base junction of the transistor 34 is forward biased. Hence, the transistor 34 is enabled to conduct in its reverse or collector-to-emitter direction. As a result the positive charge on the right-hand plate of the capacitor 36 flows downward in the digit line 15 to the sense amplifiers 32 and then from ground through the collector-to-emitter path of the transistor 34 to the left-hand plate of the capacitor 36. This downward flow of current in the digit line 15 is represented in FIG. 2 as pulse 38. The sense amplifiers interpret the occurrence of such a pulse as indicative of a "1" signal having been stored in the memory cell 20.

The aforedescribed read-1 operation discharges the capacitor included in the cell being interrogated. Accordingly, in a manner well known in the art, the "1" representation formerly stored in the cell is typically re-established therein in a write-1 operation following each such interrogation. In addition, so-called refreshing of the stored representations may be carried out periodically in a standard way to compensate for charge leakage in the depicted array.

Advantageously, both the matrix array 11 and the conventional units 26, 30 and 32 of FIG. 1, as well as other associated units not shown in FIG. 1, are fabricated in the form of a microminiature semiconductor chip. Various technologies, for example $I^2L$ or standard buried collector techniques, are available for making such an LSI chip. In accordance with one specific illustrative aspect of the principles of the present invention, it was recognized by applicant that the bipolar integrated-circuit technology known as GIMIC-O is particularly advantageous for forming the herein-considered memory unit 10. (For a description of GIMIC-O see the article by P. T. Panousis and R. L. Pritchett entitled "GIMIC-O-A Low Cost Non-Epitaxial Bipolar LSI Technology Suitable for Application to TTL Circuits," *IEDM Digest of Technical Papers*, December 1974, pages 515–518.) The circuit configurations of the aforespecified units 26, 30 and 32, as well as of other standard associated units, are advantageously formed utilizing, for example, transistor-transistor logic (TTL) or TTL-compatible circuits.

Hence, in accordance with aspects of this invention, the matrix array 11 of FIG. 1 is fabricated in GIMIC-O form to include only a single transistor and an associated capacitor at each of the multiple intersections defined by the orthogonally disposed word and digit lines. Multiple chips, each including such an array with its associated units, can therefore be made on a semiconductor wafer in a relatively simple batch fabrication process. Each chip made in this manner is characterized by ease of manufacture, high bit capacity, high speed and low cost. Significantly, each memory cell in such a chip has an area less than one square mil.

A set of specific illustrative steps to be followed to form a matrix array 11 of the particular type shown in FIG. 1 will now be described with the aid of FIGS. 3 through 8. These steps, which constitute an integrated-circuit fabrication procedure in accordance with the aforementioned GIMIC-O bipolar technology, are also applicable to the formation in a single semiconductor chip of the associated units 26, 30, 32 and other standard units (not shown) associated with the matrix array 11. Advantageously, these units are made from TTL or TTL-compatible circuits in a batch fabrication procedure at the same time that the matrix array 11 is being formed. Emphasis hereinbelow, however, will be directed only to fabricating the array 11.

Figure 3:
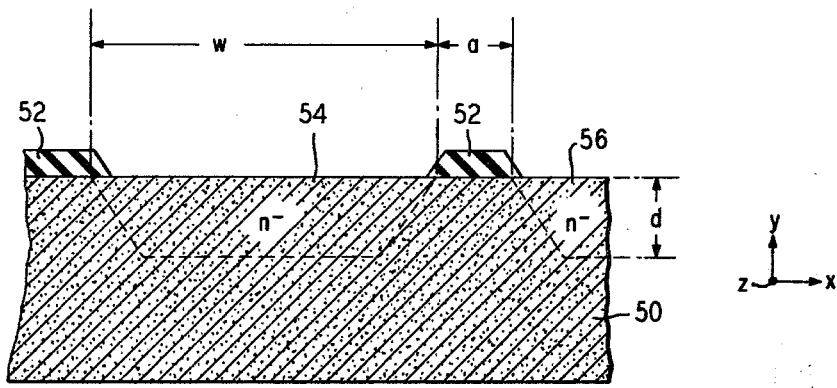
FIGS. 3 through 7 are cross-sectional side views of a portion of an LSI version of the memory array of FIG. 1.

FIG. 3 shows a p-type semiconductive substrate 50 that has a resistivity of about 8–20 ohm-centimeters. By conventional lithographic techniques, a 0.8-micrometer-thick masking layer 52 of silicon dioxide formed on the top surface of the substrate 50 is selectively patterned. The word-line regions of the array 11 are formed in unmasked portions of the substrate 50 by ion implanting a shallow phosphorus layer and diffusing the layer to a depth d of approximately 8 micrometers. The width w of each word line region is about 15 micrometers. Plural such $n^-$ regions (such as those designated 54 and 56 in FIG. 3) are formed in the substrate 50. In fact, in the particular memory configuration assumed earlier above, sixty-four such spaced-apart regions or word lines are simultaneously formed in the substrate 50 in each of two matrix arrays included in each 16-K bit chip area.

In one particular illustrative embodiment of the present invention, the word-line regions are spaced apart by a distance a (FIG. 3) of about 5 micrometers and each such region extends approximately 2 millimeters in the z direction. These regions correspond respectively to the horizontal word lines 12, 13 . . . n shown in FIG. 1.

Figure 4:
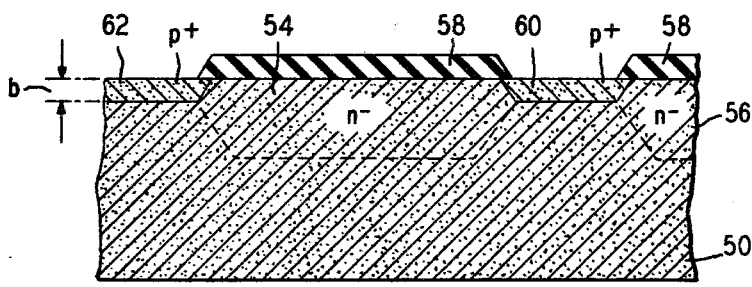
Figure 5:
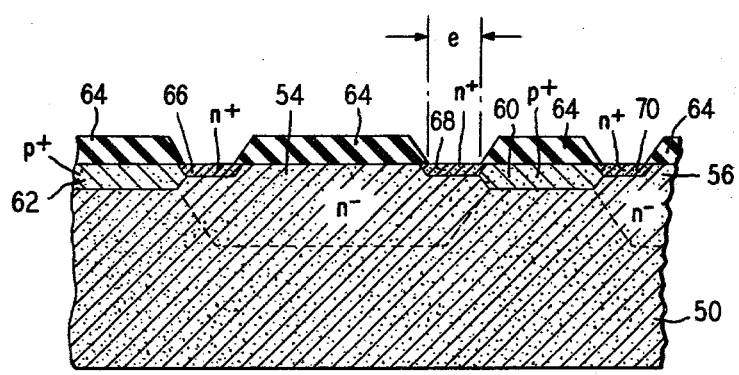

The next step in the herein-considered illustrative fabrication procedure is indicated by FIG. 4. Another selectively patterned silicon dioxide layer 58 is formed by standard techniques on the top surface of the substrate 50 to serve as a masking layer for ion implantation. Channel stops comprising $p^+$ regions such as those designated 60 and 62 in FIG. 4 are then formed in the substrate 50. These stop regions, which are coextensive with the word line regions 54 and 56, are made, for example, by a standard two-stage boron implant step. The resulting stops 60 and 62 have a depth b of about 1.2 micrometers, with a peak in the impurity concentration thereof occurring at a depth of approximately 0.7 micrometers.

Subsequently, still another selectively patterned silicon dioxide masking layer 64 (FIG. 5) is formed on the top surface of the substrate 50. N+ regions 66, 68 and 70 are then formed by diffusion in unmasked portions of the work line regions 54 and 56. Illustratively, these regions 66, 68 and 70 are formed by diffusing phosphorus into the substrate to achieve a resistivity of less than approximately 30 ohms per square. The regions 66, 68 and 70, which are designed to enhance the conductivity of the word line regions, have a depth of about 0.6 micrometers and a width e of approximately 5 micrometers.

Figure 6:
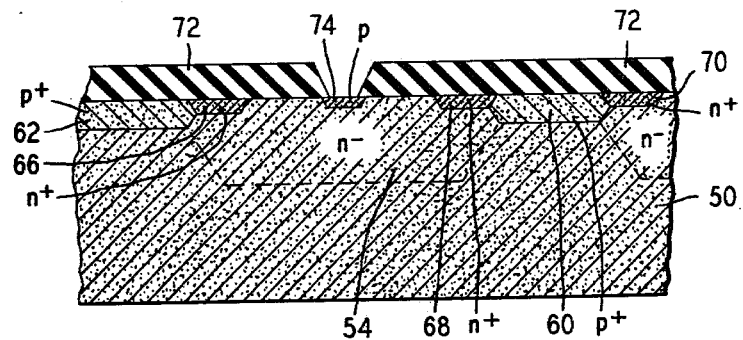

Next, as represented in FIG. 6, another masking layer is formed on the top surface of the substrate 50. This layer comprises, for example, a 5000-Angstrom-unit-thick film 72 of silicon dioxide. In standard ways known in the art, openings are formed in the masking layer at spaced-apart positions along each of the word-line regions. Thus, for example, as indicated in FIG. 6, an opening in the masking layer 72 is shown above the word line region 54. In one specific illustrative embodiment, each such opening comprises a square region about 5 micrometers by 5 micrometers.

Subsequently, p regions, such as the region 74 shown in FIG. 6, are ion implanted into the spaced-apart portions of the word-line regions made accessible by the aforespecified openings in the masking layer 72. These p regions, which are formed, for example, in a conventional boron implant step, each constitute the emitter region of one of the transistors included in the matrix array 11 represented in FIG. 1. Thus the regions 50, 54 and 74 in FIG. 6 respectively comprise the collector, base and emitter regions of one such transistor.

Figure 7:
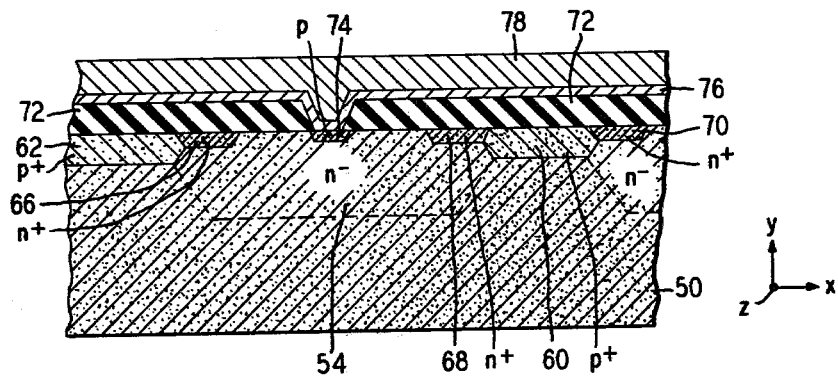

A layer of a dielectric material is formed on the entire top surface of the structure shown in FIG. 6. This layer, which comprises, for example, a 200-to-500-Angstrom-unit-thick film of silicon dioxide, is designated by reference numeral 76 in FIG. 7. Next, spaced-apart metallic bands, such as the element 78 in FIG. 7, are formed on the dielectric film 76. These bands are orthogonally disposed in the structure with respect to the aforedescribed word-line regions and constitute digit lines in the integrated array. Spaced-apart memory capacitors are defined in the array between the digit lines and the underlying p regions (emitters) such as the region 74 in FIG. 7.

In one specific illustrative embodiment of this invention, each digit-line band comprises an aluminum stripe extending about 5 micrometers in the z direction (FIG. 7) and approximately 1 millimeter in the x direction. Alternatively, various other single metals or combinations of metals (for example, a trilayer of titanium, platinum and gold) may be deposited on the structure to form the aforespecified digit lines.

Figure 8:
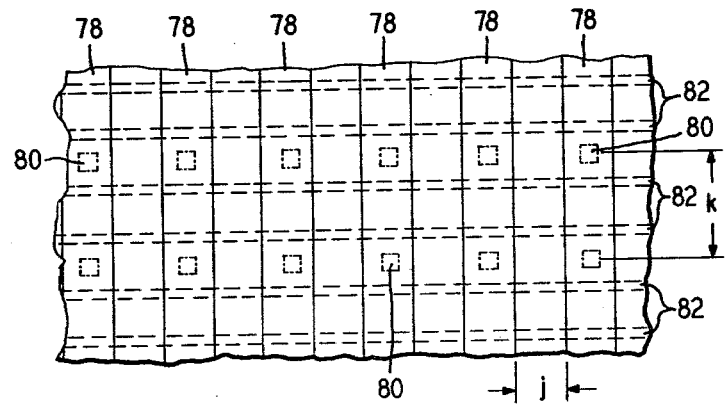
FIG. 8 is a top view of a portion of the aforespecified LSI array.

A top view of a portion of the matrix array 11 whose fabrication has been described above is depicted in FIG. 8. The spaced-apart metallic films 78 that form the digit-line bands are indicated in FIG. 8. Also represented therein in dashed-line form and designated by reference numerals 80 are the openings in the aforespecified masking layer at which capacitors are defined in the array between the digit lines 78 and the underlying p-type emitter regions in the substrate of the structure. Dashed-line bands 82 in FIG. 8 represent n+ regions that correspond to the conductivity enhancing regions 66, 68 and 70 shown in FIG. 7 and described above.

Illustratively, the digit lines 78 of FIG. 8 are spaced apart by a distance j of about 10 micrometers. Further, in one particular embodiment, the center-to-center vertical spacing k of two adjacent openings 80 is approximately 20 micrometers.

During the aforedescribed batch fabrication procedure, plural matrix arrays 11 are made simultaneously on a single semiconductor wafer. At the same time, the extremities of the digit and word lines of each such array are interconnected with the units 26, 30 and 32 shown in FIG. 1 and with other standard associated units to form plural random-access-memory units on each wafer. In this way plural small-area, high-speed, low-cost and low-power memory devices are simultaneously made. One specific illustrative such device made in LSI GIMIC-O form in accordance with the principles of the present invention constitutes a chip measuring about 4 millimeters by 4 millimeters. The access and cycle times of this illustrative unit were determined to be less than 100 and 200 nanoseconds, respectively.

Figure 9:
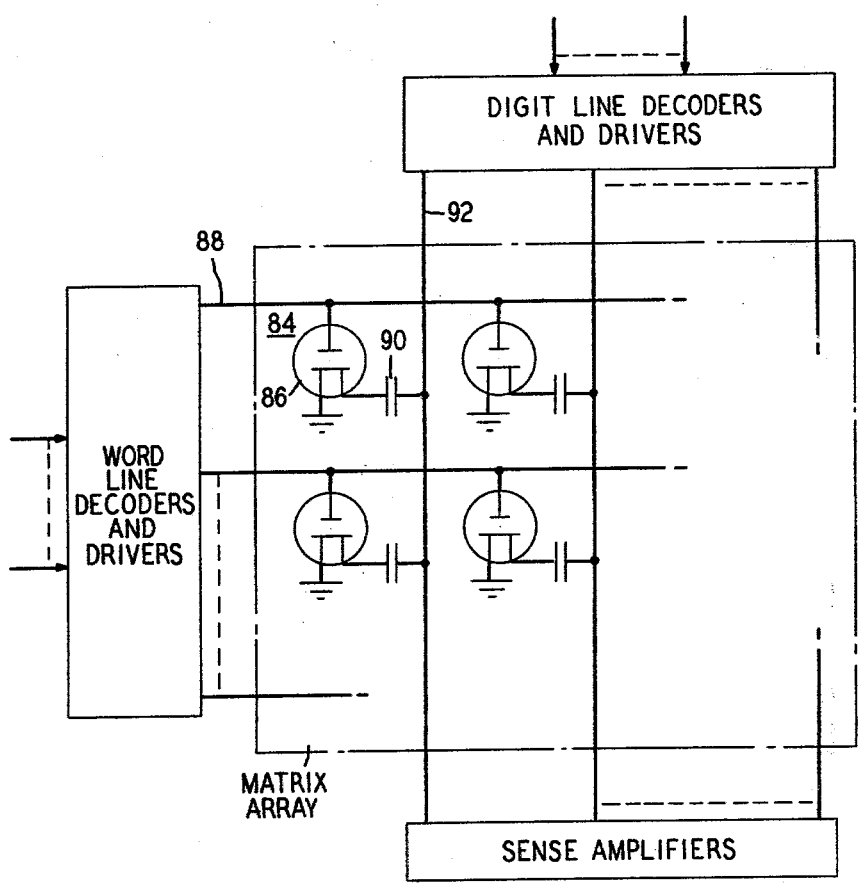
FIG. 9 shows a simplified memory array that includes specific illustrative MOS cells made in accordance with the principles of the present invention.

A specific illustrative MOS version of a memory unit made in accordance with the principles of the present invention is shown in FIG. 9. In this illustrative embodiment each memory cell in the matrix array comprises a single MOS transistor and an associated capacitor connected as shown. Thus, for example, the cell 84 of FIG. 9 comprises field-effect transistor 86 having its gate electrode directly connected to word line 88, one of its source and drain electrodes connected via capacitor 90 to digit line 92 and the other one of its source and drain electrodes connected directly to a point of reference potential such as ground.

The FIG. 9 arrangement, which operates in a manner similar to that described above in connection with FIGS. 1 and 2, is easily implementable in LSI form in accordance with various standard fabrication techniques.

Finally, it is to be understood that the above-described procedures and arrangements are only illustrative of the application of the principles of the present invention. In accordance with those principles, numerous modifications and alternatives may be devised by those skilled in the art without departing from the spirit and scope of the invention. For example, it is feasible to substitute npn transistors for the pnp devices shown in FIG. 1 provided that the polarities of the signals represented in FIG. 2 are changed correspondingly. In addition, the emitters rather than the collector electrodes of the transistors shown in FIG. 1 may be connected directly to ground. In that case, each memory capacitor is directly connected between a digit line and the collector electrode of an associated transistor.

I claim:

1. In combination in an LSI random-access-memory unit designed to store multiple information words,
    means forming multiple spaced-apart word lines,
    means orthogonally disposed with respect to said word lines forming multiple spaced-apart digit lines,
    multiple identical memory cells respectively connected at the multiple intersections defined by said orthogonally disposed word and digit lines,
    each cell at an intersection comprising
        a single transistor having base, emitter and collector electrodes,
        and a single capacitor,
        said base electrode being directly connected to the word line defining said intersection, one of said collector and emitter electrodes being connected to a point of reference potential, and the other one of said collector and emitter electrodes being connected via said capacitor to the digit line defining said intersection, and means connected to said word and digit lines for selecting a particular one of said memory cells during writing and reading operations, wherein said first-mentioned means comprises plural parallel spaced-apart regions of a specified conductivity type ion implanted in the top surface of a substrate of the opposite conductivity type to form said multiple word lines, at least one high-conductivity region of the specified conductivity type diffused in each of said regions to enhance the conductivity of said word lines, and channel stop regions of the opposite conductivity type ion implanted in the spaces between said first-mentioned regions.

2. A unit as in claim 1 further including an apertured insulating layer deposited on the top surface of said substrate, the apertures in said layer overlying spaced-apart memory cell positions disposed along the extent of each of said word lines, regions of the opposite conductivity type ion implanted through said apertures in the top surface of said substrate to form emitter regions, an insulating layer deposited on the entire top surface of said unit, and plural parallel spaced-apart metallic digit lines disposed on said second-mentioned insulating layer orthogonal to said word lines at said memory cell positions to form conductive lines that are capacitively coupled to said emitter regions.

3. A unit as in claim 2 wherein said word-line regions comprise ion-implanted $n^-$ regions formed in and near the top surface of said substrate.

4. A unit as in claim 3 wherein said high-conductivity regions comprise diffused $n^+$ regions.

5. A unit as in claim 4 wherein said channel-stop regions comprise ion-implanted $p^+$ regions.

6. In combination in a memory unit, multiple word lines, multiple digit lines disposed in nonconducting intersecting relationship with said word lines to define multiple storage locations at the respective intersections of said word and digit lines, a memory cell connected at each storage location to the associated word and digit lines defining an intersection, a word line decoder and driver unit coupled to said word lines, a digit line decoder and driver unit coupled to said digit lines, and a sense amplifier unit coupled to said digit lines, wherein the improvement resides in the configuration of each memory cell, each such cell comprising a three-electrode transistor device, a capacitor, means directly connecting one of said electrodes to the word line defining the intersection at which said cell is connected, means directly connecting a second one of said electrodes to a point of reference potential, and means connecting the third one of said electrodes via said capacitor to the digit line defining the intersection at which said cell is connected, each transistor device comprising an MOS transistor having gate, source and drain electrodes, wherein said gate electrode is directly connected to said associated word line, one of said source and drain electrodes is directly connected to said point of reference potential, and the other one of said source and drain electrodes is connected via said capacitor to said associated digit line.

7. A method for fabricating a small-area RAM unit in LSI form to make a unit characterized by high speed, low cost and low power dissipation, said method comprising the steps of forming plural parallel spaced-apart regions of a specified conductivity type in a substrate of the opposite conductivity type to form word lines, forming channel-stop regions of the opposite conductivity type in the spaces between said first-mentioned regions, forming at least one high-conductivity region of the specified conductivity type associated with each of said first-mentioned regions to enhance the conductivity of said word lines, forming an apertured insulating layer on the top surface of said substrate, the apertures in said layer overlying regularly spaced-apart memory cell positions disposed along the extent of each of said word lines, forming regions of the opposite conductivity type through said apertures in said substrate to define emitter regions, forming an insulating layer on the entire top surface of said unit.

and forming plural parallel spaced-apart metallic digit lines on said second-mentioned insulating layer orthogonal to said word lines at said memory cell positions to form conductive lines that are capacitively coupled to said emitter regions.

* * * * *

UNITED STATES PATENT AND TRADEMARK OFFICE
CERTIFICATE OF CORRECTION

PATENT NO. : 4,188,671
DATED : February 12, 1980
INVENTOR(S) : Dennis J. Lynes

It is certified that error appears in the above—identified patent and that said Letters Patent is hereby corrected as shown below:

Column 1, line 60, "of", second occurrence, should read -- and --.

Column 2, line 35, "ae" should read -- are --.

Column 3, line 29, "$t_2$" should read -- $t_7$ --.

Column 5, line 3, "work" should read -- word --.

Signed and Sealed this

Twenty-seventh Day of May 1980

[SEAL]

Attest:

SIDNEY A. DIAMOND

Attesting Officer

Commissioner of Patents and Trademarks